US008496765B2

(12) United States Patent
Orschel et al.

(10) Patent No.: US 8,496,765 B2
(45) Date of Patent: Jul. 30, 2013

(54) METHOD FOR CORRECTING SPEED DEVIATIONS BETWEEN ACTUAL AND NOMINAL PULL SPEED DURING CRYSTAL GROWTH

(75) Inventors: Benno Orschel, Saint Charles, MO (US); Keiichi Takanashi, Saga (JP)

(73) Assignees: Sumco Phoenix Corporation, Phoenix, AZ (US); Sumco Corporation, Tokyo (JP)

( * ) Notice: Subject to any disclaimer, the term of this patent is extended or adjusted under 35 U.S.C. 154(b) by 942 days.

(21) Appl. No.: 12/557,167

(22) Filed: Sep. 10, 2009

(65) Prior Publication Data

US 2011/0060467 A1    Mar. 10, 2011

(51) Int. Cl.
*C30B 35/00*    (2006.01)

(52) U.S. Cl.
USPC .................. 149/14; 149/11; 149/13; 149/15; 149/200

(58) Field of Classification Search
USPC ................................. 117/14, 11, 13, 15, 200
See application file for complete search history.

(56) References Cited

U.S. PATENT DOCUMENTS

| 4,352,785 | A | * | 10/1982 | Schellin | ......................... 117/218 |
| 5,223,078 | A | * | 6/1993 | Maeda et al. | .................... 117/15 |
| 5,970,813 | A | * | 10/1999 | Parkins et al. | ................... 74/425 |
| 6,030,451 | A | * | 2/2000 | LaBrie et al. | .................... 117/14 |

FOREIGN PATENT DOCUMENTS

| EP | 1 125 009 B1 | 12/2002 | |
| JP | 63295493 | * 12/1998 | .................... 117/202 |

* cited by examiner

*Primary Examiner* — James McDonough
(74) *Attorney, Agent, or Firm* — Brinks Hofer Gilson & Lione (57) ABSTRACT

A system and method correct crystal pulling motor speed deviations in a crystal pulling mechanism. In a first embodiment, a processor implements a tracking filter by estimating new filter state based on previous state and the since-then-travelled nominal distance, and then updating the filter state based on estimation error and filter gains which are also functions of the travelled nominal distance. In a second embodiment, a harmonic tracking filter suppresses residual harmonic modulation and allows a short time constant. Rapid variations of pulling speed may thus be corrected.

6 Claims, 4 Drawing Sheets

METHOD FOR CORRECTING SPEED DEVIATIONS BETWEEN ACTUAL AND NOMINAL PULL SPEED DURING CRYSTAL GROWTH

BACKGROUND

The present invention relates generally to a crystal pulling mechanism for the growth of semiconductor crystals. More particularly, the present invention relates to a procedure for correcting speed deviation between actual and nominal pull speed during growth of such crystals.

Most processes for fabricating semiconductor electronic components are based on single crystal silicon. Conventionally, the Czochralski process is implemented by a crystal pulling machine to produce an ingot of single crystal silicon. The Czochralski or CZ process involves melting highly pure silicon or polycrystalline silicon in a crucible located in a specifically designed furnace contained in part by a heat shield. After the silicon in the crucible is melted, a crystal lifting mechanism lowers a seed crystal into contact with the silicon melt. The mechanism then withdraws the seed to pull a growing crystal from the silicon melt. The resulting crystal is substantially free of defects and therefore suitable for manufacturing modern semiconductor devices such as integrated circuits. Other semiconductors such as gallium arsenide, indium phosphide, etc. may be processed in similar manner.

CZ production typically has very strict process control requirements to ensure quality of and uniformity of the resulting crystal. Especially important are process parameters that affect intrinsic material properties or affect process stability and process yield. Pulling speed accuracy is one of the most important parameters among these process parameters.

After formation of a crystal neck or narrow-diameter portion, the conventional CZ process enlarges the diameter of the growing crystal. This is done under automatic process control by adjusting the pulling speed or the temperature of the melt in order to maintain a desired diameter. The position of the crucible is adjusted to keep the melt level constant relative to the crystal. By controlling the pulling speed and the melt temperature, and by decreasing the melt level, the main body of the crystal ingot grows with an approximately constant diameter. During the growth process, the crucible rotates the melt in one direction and the crystal lifting mechanism rotates its pulling cable or shaft along with the seed and the crystal in an opposite direction.

The pulling speed is a closely controlled parameter. A control unit such as a personal computer or programmable logic controller is controlled to respond to input signals by providing control signals to control electromechanical devices that pull the crystal from the melt. These include one or more electric motors.

Pull speed accuracy is determined in part by how accurately a speed signal from the control unit is translated into actual mechanical crystal pulling speed. Between the control signal and the crystal are several components that can introduce errors. It is well known that the servo electronics that drives the electric motor are susceptible to drift and therefore must be regularly calibrated. However, the mechanical parts, particularly the gears that reduce the motor speed down to crystal pulling speed, are also a significant source of speed errors. For instance, almost all cable type CZ pullers employ a design that uses a worm drive at the final stage of speed reduction.

A worm drive is a gear arrangement in which a worm meshes with a worm gear, also called a worm wheel. The worm is a gear in the form of a screw. The worm is rotated about a first axis, producing rotation of the worm gear about a second, generally perpendicular, axis. The worm drive can reduce rotational speed and transmit higher torque to the output shaft. Also, worm gears are well suited for lifting heavy loads because they are self holding and allow large speed reduction ratios. These are some of the reasons they have been widely adopted in CZ applications.

However, worm gears by design can never produce a truly constant speed reduction, because of the periodically changing contact point between sprocket teeth of the worm gear and worm thread. In the best case, when high quality or new gears are used, the result is a tooth-by-tooth periodicity in the speed reduction ratio on the order of fractions of a percent. In the worst case, when inexpensive or heavily worn gears are used, the result can be a wildly varying speed reduction by several percent.

Unfortunately, it is a reality in CZ mass production that mechanical parts do wear out. It is also a reality that many pullers do not use high quality speed reducer gears. The gears may be of low quality by having, for example, only 30 sprocket teeth per turn. Also, wear may be enhanced in some applications because the worm gear is regularly overloaded every time the crystal reaches its final weight. This results in significant tooth wear within the gear's normal life span. Tooth wear is manifested as thinning or distortion of the teeth and increasing of the spaces between the teeth at tooth surfaces that engage the worm. The result is heavy tooth-by-tooth variation of the gear's actual output speed. In addition, a significant systemic variation of speed reduction occurs over the course of one turn, because the teeth wear out unevenly due to the linearly increasing load as the crystal is pulled up.

Figure 1:
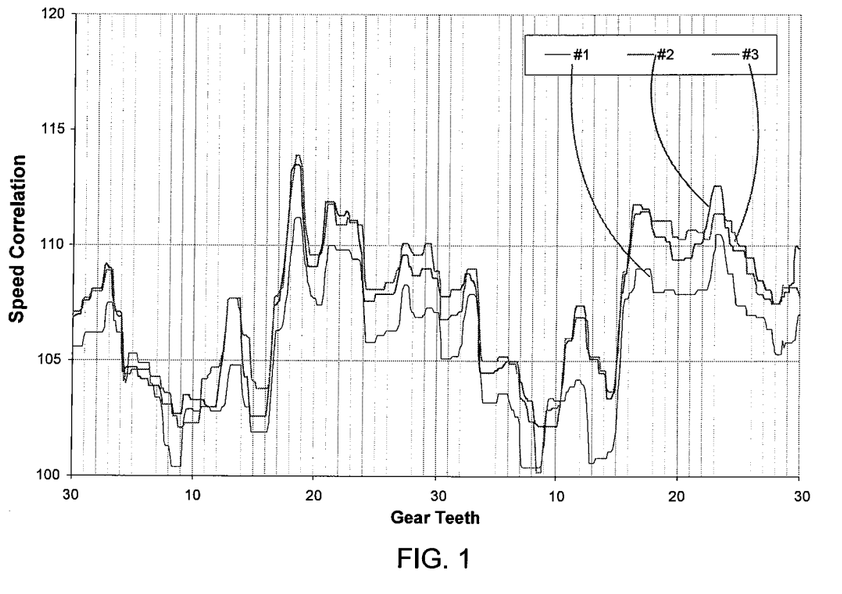
FIG. 1 illustrates speed correlation for a worn worm gear on a gear having 30 teeth.

FIG. 1 illustrates gear tooth wear on a gear having 30 teeth per turn. FIG. 1 shows output speed correlation (or percent of calibration) relative to nominal speed as a function of gear tooth for three different test runs, labeled #1, #2, and #3. The gear under test is driven by a servo motor and output speed is measured relative to a calibrated value. The gear wear creates an offset relative to the calibrated value.

As can be seen in FIG. 1, the result is heavy tooth-by-tooth variation of the gear's actual output speed. The speed variation can be quite sudden from tooth to tooth. In addition, FIG. 1 shows a significant systemic variation of speed reduction over the course of one turn, because the teeth wear out unevenly due to the linearly increasing load as the crystal is pulled up.

Figure 2:
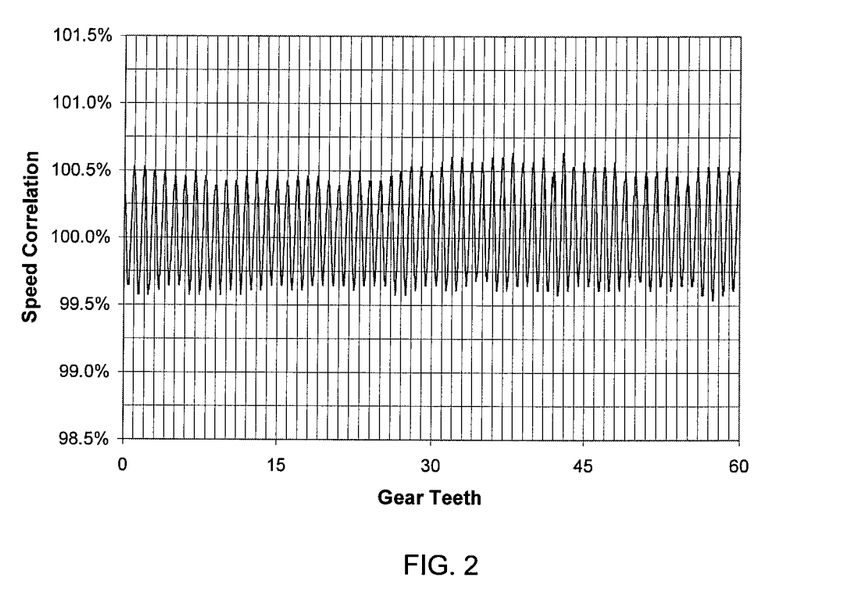
FIG. 2 illustrates speed correlation for a worm gear for a new, high quality worm gear having 60 teeth per turn.

FIG. 2 illustrates speed correlation for a worm gear as a function of gear tooth for a new, high quality worm gear having 60 teeth per turn. FIG. 2 illustrates that even quality worm gears with high load reserve and little wear produce a varying actual output speed. Thus, even a brand new, high quality worm gear will exhibit output speed variations caused by the periodically changing contact point between sprocket teeth of the worm gear and the worm thread.

While the problem of output speed variation has been described herein in connection with worm gear wear and quality, it should be noted that any number of other mechanical or electrical variations can produce similar output speed variation of the type described. There is a need for an improved crystal pulling system which can correct such output speed variation.

DETAILED DESCRIPTION OF PRESENTLY PREFERRED EMBODIMENTS

Conventional Czochralski (CZ) pulling systems have had only limited capabilities for correcting deviations of actual pulling speed from nominal pulling speed. Such conventional pulling systems have had no capability for compensating short-range (i.e., short time duration) output speed variations that are induced by the speed reducer gear or worm gear. Most conventional CZ-systems neglect the existence of deviations between nominal and actual output speed. However, there are systems which, instead of servo motors, use digitally controlled high precision motors that eliminate the possibility of servo drift. Unfortunately, this solution is not able to detect and correct speed deviations that are caused by other components such as the speed reduction gears. In addition, it is also an expensive solution because it requires hardware modifications.

The problem of mechanically introduced speed deviations was addressed in one proposal which uses an output side position encoder to measure the actual output speed and compare it to the nominal output speed. The referenced proposal thereby detects the actual speed deviation which is caused by the combined effects of servo drift and mechanical defects in the speed reduction gears. The referenced proposal uses a running average algorithm to detect and correct periodic, long-range average speed deviations.

However, until now there has been no attempt to deal with short-range speed errors. Worm gears, which are commonly used as final speed reducers in CZ systems, always produce a tooth-by-tooth speed modulation. While this effect can be relatively small in brand-new high-precision gears, it always is present and it can be significant when inexpensive or overloaded gears are used. It is also a general problem, even with high quality gears, when the gears wear out during heavy use, which is a reality in large scale CZ production.

Unfortunately, the referenced proposal is not suitable to detect and correct such short-range speed errors, because it is based on a simple running average. Such a running average proposal would suffer from severe numerical instability if it was used with a shorter averaging time. One reason for this instability is digital noise resulting from the encoder resolution. In typical CZ systems the number of encoder counts per gear tooth is relatively small. The referenced running average algorithm requires comparatively large averaging intervals to minimize digitization noise due to encoder resolution and is therefore operating with a relatively large sampling rate.

However, even with higher sampling rates and the use of higher resolution encoders, the referenced proposal would still not work satisfactorily. One reason is because the referenced proposal averages the speed error over time and would not work consistently when the nominal speed is required to significantly change up and down during operation. In a CZ system, because of diameter control, this is normally the case. In addition to that, the model used by the referenced proposal lacks a term describing the changing input/output speed ratio.

The referenced proposal only models the input-output speed ratio as a slowly changing constant. Therefore, even if used with a higher sampling rate and a higher resolution encoder, the proposal still would not be suited to detect and correct the sudden output speed errors that are present in mechanical and electrical devices such as worm gear speed reducers Referring now FIG. 3, it shows a block diagram of an exemplary semiconductor crystal growth apparatus 300. The apparatus 300 includes a control unit 302, a heater power supply 304 and a crystal growth chamber 306. The apparatus 300 further includes a crystal drive unit 308, crystal lift cables 310, a crucible drive unit 312 and a crucible drive shaft 314.

Figure 3:
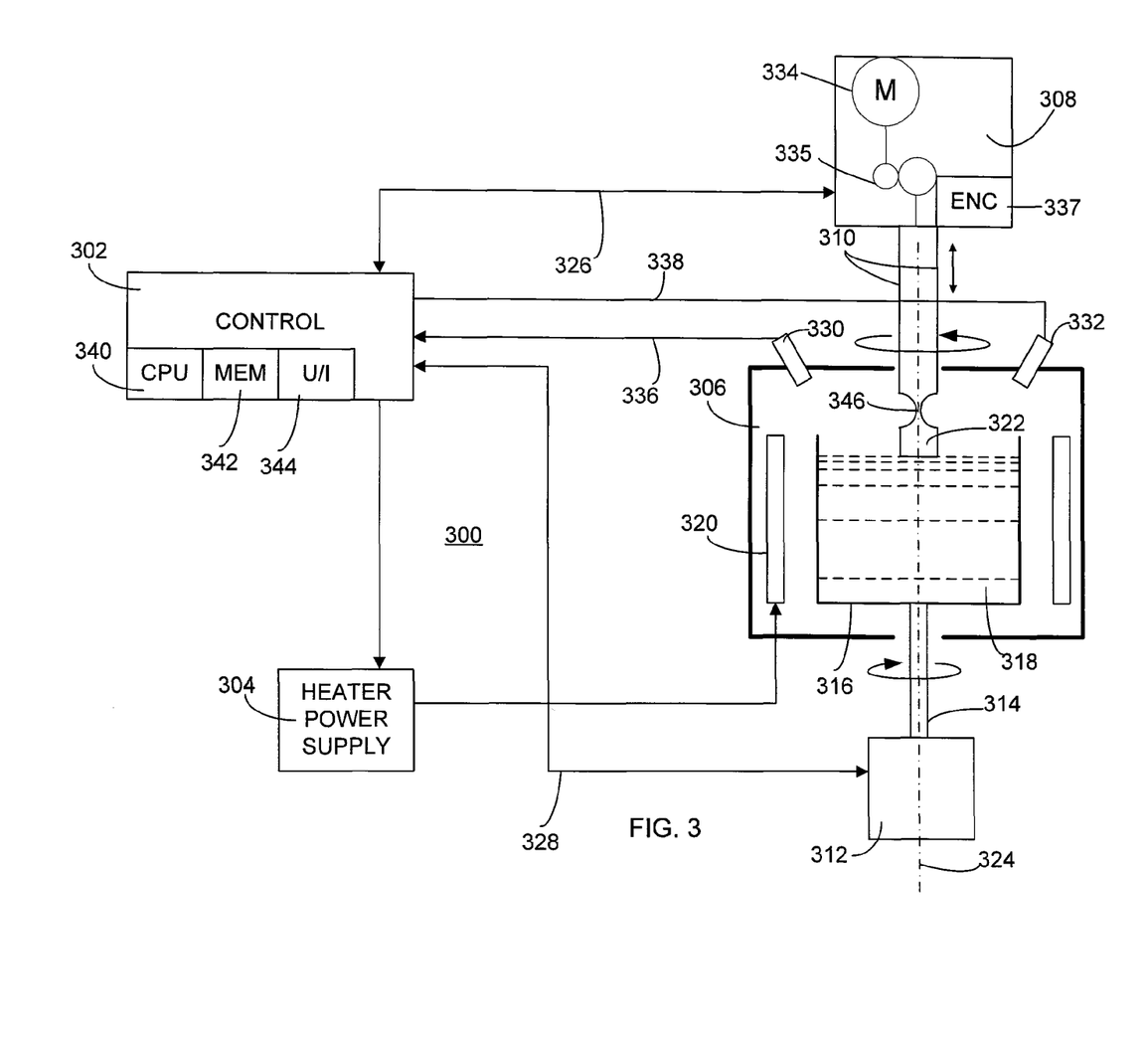
FIG. 3 is a block diagram of an exemplary semiconductor crystal growth apparatus.

Contained within the chamber 306 is a crucible 316 containing melt 318 and a heater 320. In the illustration of FIG. 3, a semiconductor crystal 322 is formed from the melt 318. The control unit 302 is coupled with the heater power supply 304 to control the heater power supply 304. By controlling the heater power supply 304, the temperature of the melt 318 is controlled to permit controlled growth of the semiconductor crystal 322. To further control temperature of the melt, a heat controller may be added as well.

The crystal drive unit 308 operates to pull the crystal lift cables 310 along a center axis 324. The crystal drive unit 308 also operates to rotate the crystal lift cables 310 about the center axis 324. In FIG. 3, counterclockwise rotation is indicated, but clockwise rotation may be substituted and both may be available by appropriate control of the crystal drive unit 308. Rotation or movement of the crystal lift cables 310 causes like rotation or movement of the crystal 322.

The crystal drive unit 308 in this exemplary embodiment includes an electric motor 334, a worm drive 335 and an encoder 337. The electric motor 334 operates to pull the crystal lift cables 310 and the crystal 322. A separate electric motor rotates the crystal lift cables 310 and the crystal 322. The crystal drive unit 308 including the electric motor 334 is controlled by signals provided over a control line 326 from the control unit 302. The control line 326 may be a data bus or a group of conductors for conveying digital data or analog signals. In particular, the control unit 302 provides a motor signal to control the speed at which the electric motor 334 lifts the crystal lift cables 310 and the crystal 322. The motor signal in one embodiment is a voltage proportional to the pulling speed of the motor.

As the crystal lift cables 310 and the crystal 322 are raised, the encoder 337 produces an encoder signal indicative of the distance the crystal has been lowered or raised by the electric motor 334. The signal may be in the form of digital data or a digital value expressing angular distance, such as an angular distance travelled, which is a fraction of angular distance travelled by the electric motor 334, whose travelled distance is reduced by the worm gear 335. The encoder signal may alternatively be referred to as an encoder count, for example, to indicate digital data representative of a distance of travel determined by the encoder. The encoder signal is provided to the control unit 302 on control line 326.

The worm drive 335 is positioned between the electric motor 334 and the crystal lift cables 310. The worm drive 335 is a gear arrangement in which a worm meshes with a worm gear. The worm is a gear in the form of a screw. The worm is rotated about a first axis by the electric motor 334, producing rotation of the worm gear about a second, generally perpendicular, axis, such as the center axis 324. The worm drive reduces rotational speed from the electric motor 334 and transmits higher torque to an output shaft connected to the crystal lift cables 310. Thus, the electric motor 334 and worm drive operate to move the crystal 322 along the center axis 324. Other mechanical or electromechanical drive components may be positioned between the motor 334 and the crystal lift cables 310. All of these components are susceptible to wear and distortion and imperfections and may introduce deviations in the pulling speed imposed by the motor 334 on the crystal lift cables 310.

Similarly, the crucible drive unit 312 operates to move the crucible drive shaft 314 along the center axis 324 and to rotate the crucible drive shaft 314 about the center axis 324. In FIG. 3, clockwise rotation is indicated, but counterclockwise rotation may be substituted and both may be available by appropriate control of the crucible drive unit 312. Rotation or movement of the crucible drive shaft 314 causes like rotation or movement of the crucible 316. The crucible drive unit 312 includes one or more electric motors or other devices for pulling and rotating the crucible drive shaft 314. The crucible drive unit 312 is controlled by signals proved over a control line 328 from the control unit 302.

The chamber 306 includes one or more sensors. In the exemplary embodiment of FIG. 3, these include a camera 330 and a temperature sensor 332. The camera 330 is mounted near a viewing port of the chamber and directed to view the surface of the melt 318. The camera 330 produces signals indicative of a camera image on a control line 336 and provides the signals to the control unit 302. The temperature sensor 332 detects temperature in the chamber 306 and provides data indicative of the temperature to the control unit 302 on a control line 338.

The control unit 302 in the illustrated embodiment generally includes a central processing unit (CPU) 340, a memory 342 and a user interface 344. The CPU 340 may be any suitable processing device such as a microprocessor, digital signal processor, digital logic function or a computer. The CPU 340 operates according to data and instructions stored in memory 342. Further, the CPU 340 operates using data and other information received from sensors such as over control lines 326, 328, 336, 338. Still further, the CPU 340 operates to generate control signals to control portions of the semiconductor crystal growth apparatus 300 such as the heater power supply 304, the crystal drive unit 308 and the crucible drive unit 312. The CPU 340 may further implement real-time functions using a built-in timer or in response to clocking signals generated by the CPU 340 or another device.

The memory 342 may be any type of dynamic or persistent memory such as semiconductor memory, magnetic or optical disk or any combination of these or other storage. In some applications, the memory 342 may include a computer readable storage medium containing data to cause the CPU 340 to perform certain specified functions in conjunction with other components of the semiconductor crystal growth apparatus 300. For example, stored data and instructions in the memory 342 may cause the CPU 340 to implement a control program for controlling the pulling speed of the motor 334 using input information from the encoder 337. The control program may implement a filter function such as a harmonic tracking filter or a polynomial tracking filter. Data defining filter states, such as a present filter state, a past filter state and a next or subsequent filter state are stored in the memory 342.

The user interface 344 permits user control and monitoring of the semiconductor crystal growth apparatus 300. The user interface 344 may include any suitable display for providing operational information to a user and may include any sort of keyboard or switches to permit user control and actuation of the semiconductor crystal growth apparatus 300.

The semiconductor crystal growth apparatus 300 enables growth of a single crystal semiconductor ingot according to the Czochralski process. According to this process, semiconductor material such as silicon is placed in the crucible 316.

The heater power supply 304 actuates the heater 320 to heat the silicon and cause it to melt. The heater 320 maintains the silicon melt 318 in a liquid state. According to the conventional process, a seed crystal 346 is attached to the crystal lift cables 310. The seed crystal 346 is lowered into the melt 318 by the crystal drive unit 308. Further, the crystal drive unit 308 causes the crystal lift cables 310 and the seed crystal 346 to rotate in a first direction, such as counterclockwise, while the crucible drive unit 312 causes the crucible drive shaft 314 and the crucible 316 to rotate in the opposite direction, such as clockwise. The crucible drive unit 312 may also raise or lower the crucible 316 as required during the crystal growth process. For example, the melt 318 depletes as the crystal is grown, so the crucible drive unit is raised to compensate and keep the melt level substantially constant. During this process, the heater power supply 304, the crystal drive unit 308 and the crucible drive unit 312 all operate under control of the control unit 302.

In accordance with the present embodiments, the control unit 302 operates to detect deviations in the pulling speed applied to the crystal by the crystal drive unit 308 and to correct such deviations. More particularly, the control unit 302 in a first embodiment implements a recursive algorithm of a kinematic model filter for tracking the position of the encoder 337. The encoder position is represented by the digital data produced by the encoder 337 and provided to the control unit 302 and representative of the distance the crystal 322 has been raised or lowered by the crystal drive unit 308. In another embodiment, the control unit 302 implements a fading average tracking filter based on a filter with harmonic components. Either embodiment may be used to substantially reduce or eliminate deviations between a nominal or desired pulling speed and the actual pulling speed.

In the first embodiment, a discrete second order polynomial is chosen as the filter model. The polynomial approximates the encoder position as a function of nominal position in a neighborhood around the current position. The polynomial chosen has the following form:

$$Y_e = \text{INT}(a + bx + cx^2) \tag{1}$$

wherein a, b, c represent the filter state, x represents the nominal encoder position, and $Y_e$ represents the estimated discrete encoder position.

The INT function returns the integer value of its argument, which may be a real number. The INT function is used here because we model the encoder reading. The encoder reading is a discrete number of the real position. If we didn't use the INT function here, we would introduce noise due to artificial filter updates when the difference between estimated position and encoder reading is less than one encoder count. In some applications, use of the INT function in the filter model may be important to overall accuracy. The encoder count is sampled periodically, for example, once per second. As a result, the pulses provided by the encoder 337 increment in integral steps. Between the pulses (received once per second), there is no change in the encoder signal. However, between the sampled pulses, the crystal drive unit 308 advances and the actual position changes. The filter calculates the difference between the sampled position from the encoder and a predicted position. Use of the INT function prevents the introduction of a special form of digital noise in the first derivative of the filter output, parameter b in Equation (1). This noise would be introduced by filter updates during sample intervals without encoder count changes. Without use of the INT function, the filter state would be updated continuously to an apparently constant position until the next encoder sample is received, causing the first derivative to artificially relax and then jump at the next encoder count increment.

To develop a recursive algorithm for fitting equation (1) to the encoder count data we use the following weighted least square error ansatz. The square error sum is represented by the following equation:

$$E = \Sigma_i e^{-(x0-xi)/L} * (Y_{e,i} - Y_i)^2 \quad i = 0, -1, -2, \tag{2a}$$

where $x_0$ represents the current encoder position
$x_i$ represents encoder position at sampling interval i.
L represents the filter constant (characteristic length)
$Y_i$ represents encoder reading at sampling interval i
$Y_{e,i}$ represents encoder approximation at sampling interval i.

In this model, individual errors are weighted such that the weight function exponentially fades out past data according to their distance from the current position. This ansatz results in a filter algorithm that has some similarities to the well known alpha-beta-gamma filter. However, besides the difference in the filter gains, the most important difference is that tuning of the present filter will be straightforward for the present applications, because the filter constant will be expressed as a characteristic length, which in the present case is a certain portion of one gear tooth. In contrast to that, it is much less intuitive to relate the maneuver index of an alpha-beta-gamma-filter to this application critical characteristic length.

Deriving E for the model constants {a,b,c} leads to the equation system $$0 = d/da(E) \tag{2b}$$

$$0 = d/db(E) \tag{2c}$$

$$0 = d/dc(E) \tag{2d}$$

Solving this equation system yields the model constants {a,b,c}.

The model of equation (1) is developed into a recursive algorithm so that this weighted least square fit over all past encoder position data can be practically carried out at each sampling interval with minimal processing time and memory storage.

By choosing this approach, the following benefits are obtained. First, by using a least squares fit based a second order polynomial approximation instead of a simple running average, the filter can accurately follow sudden changes in motor speed. Such sudden changes are illustrated, for example, in FIGS. 1 and 2. A running average approximation can not accurately follow and correct such sudden changes.

Second, by using a weight function that fades out past data according to distance as opposed to sample time, the filter approximation is always carried out with respect to the characteristic length of speed modulation caused by the gear teeth or other error source. Therefore, filter-tuning is easy to understand. The accuracy of the estimation is maintained regardless of momentary or suddenly changing pull speed.

Third, by performing a least squares fit explicitly on discrete errors, this approach minimizes digitization noise. This ensures that the filter operates accurately, regardless of the number of encoder pulses per sample interval.

The model of equation (1) is developed into a recursive algorithm that operates by estimating a new filter state based on a previous filter state and the since-then-traveled nominal distance $\Delta x$, and then updating the filter state based on estimation error and filter gains which are themselves functions of $\Delta x$.

As noted, this approach is somewhat similar to an alpha-beta-gamma-filter. One difference is that the model of Equation (1) does not involve measurement noise, which is a meaningful assumption since the encoder readings in the present application are substantially noise free, or, if we treated the difference between real and discrete values as noise, would not be white Gaussian noise, which is a premise for alpha-beta-gamma and similar filters. That approach, in contrast to alpha-beta-gamma-filters, where finding correct filter gains is a more complex task, enables a straightforward choice of filter gains, simply based on characteristic gear geometry like tooth to tooth distance.

Figure 4:
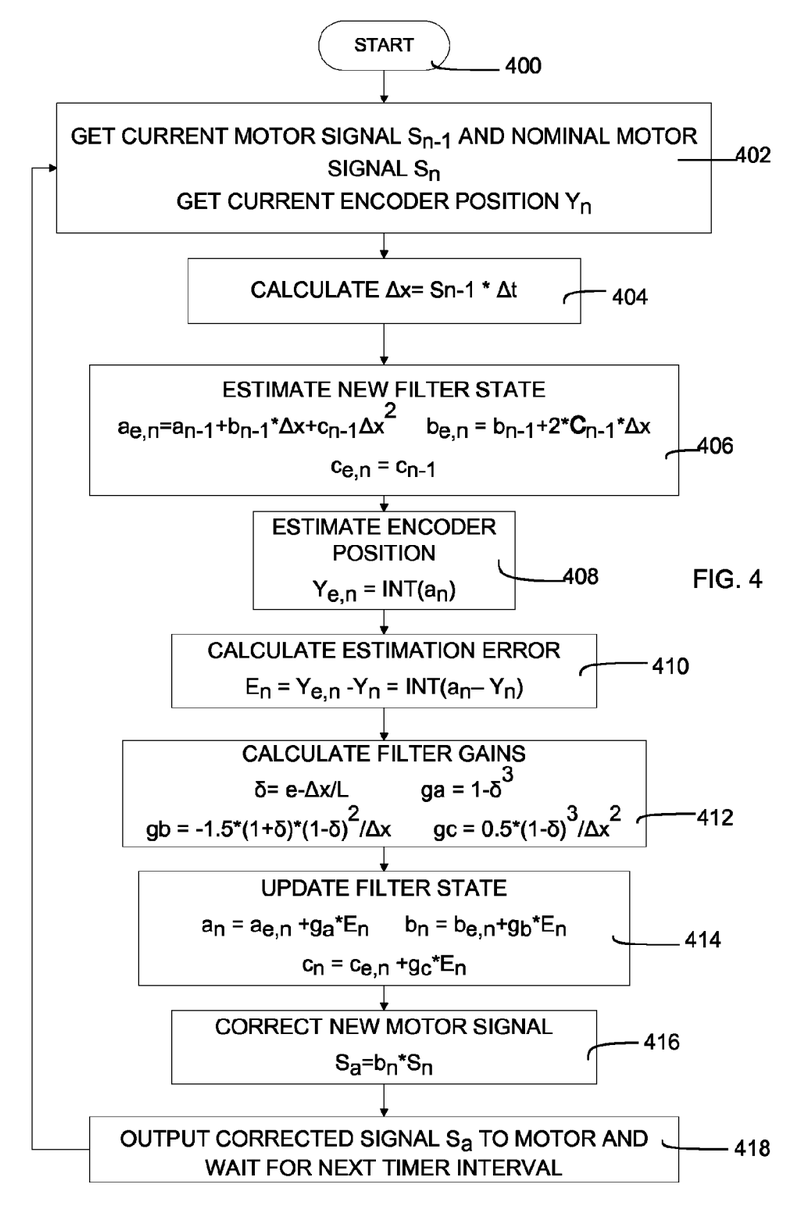
FIG. 4 is a flow diagram illustrating a method for correcting speed deviations in a semiconductor crystal growth apparatus.

FIG. 4 is a flow diagram illustrating a method for correcting speed deviations in a semiconductor crystal growth apparatus. The method of FIG. 4 may be implemented, for example, by the control unit 302. The CPU 340 may retrieve instructions and data from the memory 342 or receive data from control signals such as signals from the encoder 337 received over control line 326. The control signals may be pre-processed, such as by converting an angular position produced by the encoder 337 to a linear position. Further, the CPU 340 responds to the received data and instructions by processing the data to effect the method steps shown in FIG. 4 as well as other operations. Still further, the CPU produces output data for storage in the memory 342 and produces control signals such as the motor signal applied to control line 326 to control the speed at which the electric motor 334 lifts the crystal lift cables 310 and the crystal 322.

The method begins at block 400. At block 402, The CPU 340 enters a processing loop and retrieves from memory 340 the current motor signal $S_{n-1}$ and the new nominal motor signal $S_n$. The current motor signal may be digital data encoding a voltage suitable to cause the motor 334 to operate at a specified linear speed expressed in feet per second or an angular speed expressed in radians per second. The data may be converted between angular and linear domains as appropriate to reduce processing overhead or storage requirements. Further at block 402, the processor retrieves the current encoder position, $Y_n$. The current encoder position may be stored in memory 342 after being received from the encoder 337 or the current value provided by the encoder 337 on the control line 326 may be read and processed. FIG. 4 illustrates a recursive algorithm that is executed once per real-time interval $\Delta t$.

At block 402, a value for $\Delta x$ is calculated as $$\Delta x = S_{n-1} * \Delta t \tag{3}$$

$\Delta x$ is the nominal encoder count distance traveled during the last sampling interval. $\Delta x$ is a non-discrete value. It is calculated based on the last nominal motor signal $S_{n-1}$ (having units of encoder count per time) and sampling time interval $\Delta t$. The sampling time interval $\Delta t$ is determined by the CPU 340, such as by lapse of a programmed clock circuit or function. The nominal motor signal $S_{n-1}$ may be the output of another algorithm, such as a diameter control procedure for controlling the diameter of the crystal 322.

At block 406, the new filter state is estimated using the following equations.

$$a_e = a_{n-1} + b_{n-i} * \Delta x + c_{n-1} \Delta x^2 \tag{4a}$$

$$b_{e,n} = b_{n-1} + 2 * c_{n-1} * \Delta x \tag{4b}$$

$$c_{e,n} = c_{n-1} \tag{4c}$$

Previously generated filter coefficients a, b and c for respective sampling times are retrieved from storage in the memory 342.

At block 408, the CPU 340 estimates a new encoder position using the INT(x) function on the filter coefficient a for the current time sampling interval:

$$Y_{e,n} = \text{INT}(a_n) \quad (5)$$

At block 410, the CPU 340 calculates an encoder estimation error:

$$E_n = Y_n - Y_{e,n} = \text{INT}(Y_n - a_n) \quad (6)$$

At block 412, the CPU 340 calculates filter gains for the next filter update using the follow system of equations:

$$\delta = e^{-\Delta x/L}$$

$$g_a = 1 - \delta^3 \quad (7a)$$

$$g_b = 3/2 * (1-\delta)^2 * (1+\delta)/\Delta x \quad (7b)$$

$$g_c = 1/2 * (1-\delta)^3 / \Delta x^2 \quad (7c)$$

At block 414, the CPU 340 updates the filter state as follows:

$$a_n = a_{e,n} + g_a * E_n \quad (8a)$$

$$b_n = b_{e,n} + g_b * E_n \quad (8b)$$

$$c_n = c_{e,n} + g_c * E_n \quad (8c)$$

At each sampling interval, the new value for $a_n$ represents the estimated current position, which is a non-discrete value with sub-encoder accuracy. At the same time, at each sampling interval, $b_n$ represents the current actual to nominal speed ratio, which is ideally 1 but deviates from 1 as a result of gear imperfections, servo drift, etc. In a step shown at block 416, $b_n$ is used to correct the signal that is actually supplied to the motor.

$$S_a = b_n * S_n \quad (9)$$

$S_n$ is the nominal motor signal for the next time interval and $S_a$ is the actual motor signal that will be applied. This actually-applied motor signal $S_a$ is corrected for any defect, either mechanical or electronic, that may cause speed errors anywhere in between the motor signal and encoder measurement. Finally, the corrected motor signal $S_a$ is applied to the motor and the algorithm waits for the next real-time interval. In response to the corrected motor signal $S_a$, the motor speed is increased or decreased during the following time interval to correct for any mechanical or electronic abnormalities such as a worn gear.

Thus, the illustrated method detects a change in position $\Delta x$ and uses that value to determine a ratio of the current actual motor speed to a desired or nominal motor speed. Using the ratio, the method determines an actual motor speed that should be applied during the subsequent time interval and generates the motor speed signal using that actual motor speed.

Figure 5:
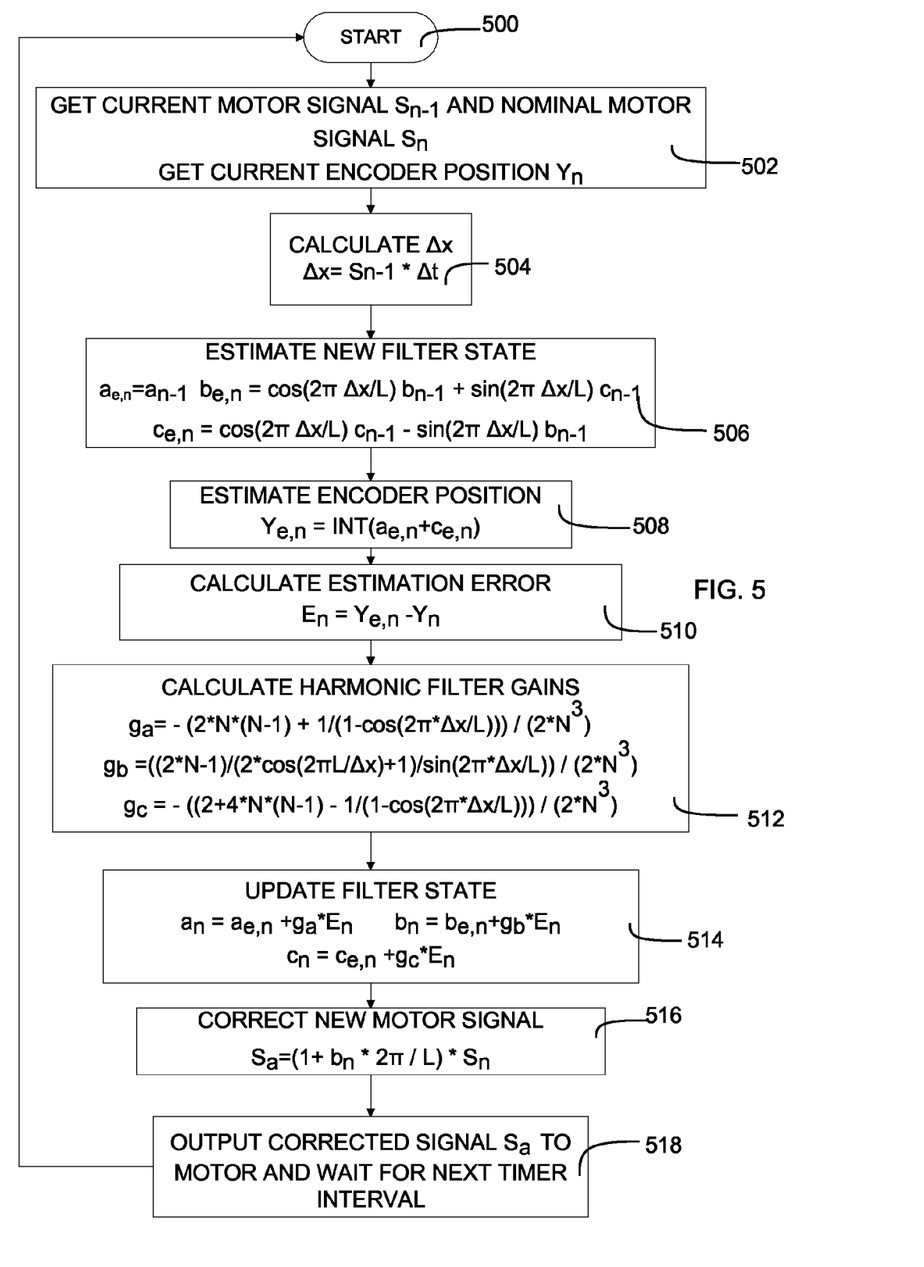
FIG. 5 is a flow diagram illustrating an alternative method for correcting speed deviations in a semiconductor crystal growth apparatus.

FIG. 5 is a flow diagram illustrating an alternative embodiment of a method for correcting speed deviations in a semiconductor crystal growth apparatus. The illustrated method can be especially useful in applications where the speed deviation is partially or substantially harmonic or periodic in nature.

Many instrumentation applications involve measuring signals that have a harmonic modulation superimposed thereon. Traditionally this is dealt with by time-averaging the signal with a filter time constant in excess of several modulation periods. However, this time-averaging approach may not be able to completely remove the modulation. This conventional approach can only reduce the modulation to a certain degree. The longer the time constant of the averaging filter, the less the residual modulation in the filter output, but the slower the filter response to genuine signal changes. In many cases a slow filter response is not acceptable, so that such a filter always has to strike a balance between residual modulation and response time.

Fortunately, in many cases the modulation periodicity is well known from other system parameters. For example, FIG. 2 shows output speed correlation in relation to sprocket teeth for a new, high quality 60 teeth per turn worm gear. By design even a brand new, high quality worm gear shows output speed variations, caused by the periodically changing contact point between sprocket teeth and worm thread. The output speed correlation has a frequency determined by the worm gear rotation frequency, which is well known.

In such a case, it is possible to develop a fading average tracking filter based on a filter model with harmonic component(s). Such a filter would effectively suppress residual modulation while at the same time allowing a short filter time constant, resulting in quick and precise filter response. If the frequency is exactly known and the modulation purely harmonic, the filter may even eliminate such residual modulation.

A fading average maximum-likelihood equation system has been developed for a filter model with a constant and one harmonic component. This equation system has been further transformed into a recursive algorithm with very few numerical operations that is easy to implement in a computer program for efficient evaluation in a processing device such as the CPU 340 of FIG. 3.

The filter input is modeled as a superposition of a slowly changing or nearly constant part that is superimposed with a harmonic modulation component:

$$y = a - b\sin(\omega k) + c\cos(\omega k) \quad (10)$$

with $\omega = 2\pi/L$, where L is the period length of the harmonic component.

FIG. 5 illustrates an implementation of this filter. The input signal to the filter is, in the exemplary embodiment of FIG. 3, the encoder signal from the encoder 337. This signal typically has a harmonic or periodic modulation imposed thereon as in Equation (10) and is thus susceptible to processing in this filter. The process of FIG. 5 may be repeated periodically such as after elapse of a predetermined timer interval $\Delta t$. The timer interval may be on the order of seconds or minutes. After the timer interval elapses, the method begins at block 500.

At block 502, the current motor signal $S_{n-1}$ and the nominal motor signal $S_n$ are obtained, for example, by reading data stored in a memory such as memory 342. Further at block 502, the current encoder position $Y_n$ is obtained, for example by reading the output from the encoder 337. At block 504, $\Delta x$, the expected distance the motor has moved during the current time increment, is calculated as the product of the current motor signal $S_{n-1}$ and the current time increment.

At block 506, a new filter state is estimated using the relation shown in the figure, and where a, b and c are the coefficients in Equation (10) and L is the period length of the harmonic component. At block 508, the current encoder position $Y_{e,n}$ is estimated. In the illustrated embodiment, the current encoder position is estimated by evaluating an integer function for a sum of filter coefficients of the new filter state. In this example, the first filter coefficient $a_{e,n}$ and $c_{e,n}$, are used to estimate the encoder position.

At block 510, the method determines estimation error as the difference between the estimated encoder position $Y_{e,n}$ and the current encoder position $Y_n$.

At block 512, the harmonic filter gains $g_a$, $g_b$ and $g_c$ are calculated using the relations shown in the figure, with N being the number of effective points, or filter constant. Then at block 514, the filter state is updated using the previous filter state, the calculated harmonic filter gains and the estimation error.

A corrected motor signal is determined at block 516 and at block 518, the corrected motor signal $S_a$ is provided to the motor. The process then waits for elapse of the next timer interval $\Delta t$. The corrected motor signal sets the motor speed during the subsequent timer interval to control the pull speed of the crystal during that timer interval.

Implementation of the equations and processes described herein using a data processing system to operate on received data and produce an output control signal are well within the purview of those ordinarily skilled in the art of filter design, control systems and data processing. Further, the equations and other relations described herein may be readily adapted to other systems, other inputs and other outputs.

From the foregoing, it can be seen that the present embodiments provide an improved system and method for correcting deviations in pulling speed from a nominal pulling speed in a crystal pulling mechanism. Deviations due to non-optimal or worn components are substantially or entirely eliminated. The result is a much more precisely controlled pulling speed. Since the pulling speed affects other quality factors in the crystal pulling process, such as diameter control and crystal quality, the result is a substantially improved process with no added hardware. The system and method may be implemented using conventional hardware on existing implementations by modifying control software of the crystal pulling apparatus.

It is therefore intended that the foregoing detailed description be regarded as illustrative rather than limiting, and that it be understood that it is the following claims, including all equivalents, that are intended to define the spirit and scope of this invention.

For simplicity, the terms "control unit," "CPU", "processor," and "encoder" are used in the specification and claims to broadly refer to hardware and/or software that can be used to perform the functions described above. It is important to note that any appropriate software language and any appropriate hardware, analog or digital, now in existence or later developed, can be used. A computer-usable medium having computer readable program code embodied therein can be used to perform the functions described above, and the functions described above can alternatively be implemented exclusively with hardware. Additionally, the functionality associated with each element can be combined with or distributed to other elements. Also, some of the elements described above may not be needed in all embodiments.

The invention claimed is:

1. A method for correcting crystal pulling motor speed deviations of an actual speed of a crystal pulling motor from a nominal pulling speed in a crystal pulling mechanism, the method comprising:
   at a processor, determining a change in position of the crystal pulling mechanism when the crystal pulling mechanism is moving at the actual speed;
   implementing a filter function on the processor;
   based on the detected change in position, at the processor, estimating a new filter state for the filter function;
   at the processor, estimating a new position of the crystal pulling mechanism using the estimated new filter state;
   at the processor, determining a position estimation error;
   at the processor, determining filter gains for a next filter state for the filter function; and
   at the processor, using one or more of the estimated filter gains for the next filter state, correcting deviations of the actual speed of the crystal pulling mechanism from the nominal speed for a subsequent time period.

2. The method of claim 1 further comprising using the filter gains and the estimated new filter state to determine a new filter state.

3. The method of claim 2 wherein determining a new filter state comprises determining a first value representing an estimated position of the crystal pulling mechanism and a second value representing a ratio of a current actual speed of the crystal pulling mechanism to desired speed of the crystal pulling mechanism.

4. The method of claim 3 wherein correcting the actual speed of the crystal pulling mechanism comprises, at the processor, combining the second value and a signal value representing the desired speed of the crystal pulling mechanism to produce a signal value representing the actual speed of the crystal pulling mechanism for a next time interval.

5. The method of claim 1 wherein correcting the actual speed of the crystal pulling mechanism comprises providing a corrected motor signal to a motor pulling a crystal ingot from a crucible, the motor responsive to the corrected motor signal to pull the crystal ingot at a corrected speed which is proportional to a voltage value of the corrected motor signal.

6. The method of claim 1 wherein estimating a new position of the crystal pulling mechanism comprises determining an integer portion only of a value representing current position of the crystal pulling mechanism.

* * * * *